(12) United States Patent
Elmadjian et al.

(10) Patent No.: US 7,081,411 B2
(45) Date of Patent: Jul. 25, 2006

(54) WAFER ETCHING TECHNIQUES

(75) Inventors: Raffi N Elmadjian, Arcadia, CA (US); Edwin W Sabin, Redondo Beach, CA (US); Harvey N Rogers, Playa Del Rey, CA (US)

(73) Assignee: Northrop Grumman Corporation, Los Angeles, CA (US)

( * ) Notice: Subject to any disclaimer, the term of this patent is extended or adjusted under 35 U.S.C. 154(b) by 203 days.

(21) Appl. No.: 10/688,238

(22) Filed: Oct. 18, 2003

(65) Prior Publication Data

US 2005/0085091 A1  Apr. 21, 2005

(51) Int. Cl.
 *H01L 21/311* (2006.01)
(52) U.S. Cl. ................. 438/700; 438/719
(58) Field of Classification Search ........... 438/700, 438/706, 710, 712, 714, 718, 719, 720
See application file for complete search history.

(56) References Cited

U.S. PATENT DOCUMENTS

| | | | | |
|---|---|---|---|---|
| 4,959,705 A | * | 9/1990 | Lemnios et al. | 257/532 |
| 5,338,394 A | * | 8/1994 | Fathimulla et al. | 438/718 |
| 5,395,799 A | * | 3/1995 | Yu | 438/232 |
| 6,348,301 B1 | * | 2/2002 | Lin | 430/330 |
| 6,406,995 B1 | * | 6/2002 | Hussein et al. | 438/638 |
| 6,462,419 B1 | * | 10/2002 | Asai | 257/774 |
| 6,468,889 B1 | * | 10/2002 | Iacoponi et al. | 438/597 |
| 6,635,185 B1 | * | 10/2003 | Demmin et al. | 216/64 |

(Continued)

FOREIGN PATENT DOCUMENTS

JP    1082629    3/1989

OTHER PUBLICATIONS

Khare, et al., "CH4/H2/Ar/Cl2 electron cyclotron resonance plasma etching of via holes for InP-based microwave devices", Journal of Vacuum Science & Technology, Sep./Oct. 1994.
Pgs. 2947-2951, vol. 12, No. 5, American Institute of Physics, New York, USA.

(Continued)

*Primary Examiner*—Kin-Chan Chen
(74) *Attorney, Agent, or Firm*—Carmen B. Patti & Assoc., LLC

(57) ABSTRACT

A method (10) for etching a through via (116, 118) on a wafer (100) of semiconductor material (102), wherein the wafer (100) has a front side surface (110) and a backside surface (106), is described. A layer of photoresist material (104) is applied to the backside surface (106). The layer of photoresist (104) is then exposed to a light source through a mask having a pre-selected pattern, wherein the developed photoresist is removed to form at least one via (112, 114) in the remaining photoresist layer (104). The remaining photoresist layer (104') is then baked in order to form a hardened, remaining photoresist layer (104"). The semiconductor material 102 adjacent to the at least one via (112, 114) is then gas plasma etched to form a through via (116, 118) between the backside surface (106) and the front side surface (110). The hardened, remaining photoresist layer (104") is then removed and a layer of conductive material (120) is then applied to the surface of the through via (116, 118) to establish electrical connectivity between the backside surface (106) and the front side surface (110).

15 Claims, 8 Drawing Sheets

U.S. PATENT DOCUMENTS

| | | | |
|---|---|---|---|
| 6,649,082 B1 * | 11/2003 | Hayasaka et al. | 252/79.1 |
| 6,864,172 B1 * | 3/2005 | Noma et al. | 438/674 |
| 6,873,054 B1 * | 3/2005 | Miyazawa et al. | 257/774 |
| 2002/0088608 A1 * | 7/2002 | Park | 165/80.3 |
| 2004/0063268 A1 * | 4/2004 | Noma et al. | 438/202 |
| 2005/0098855 A1 * | 5/2005 | Shimoji et al. | 257/621 |

OTHER PUBLICATIONS

Hur, et al., "Reactive ion etching of InP via holes", Journal of Vacuum Science & Technology, May/Jun. 1994, pp. 1410-1412, vol. 12, No. 3, American Institute of Physics, NY.

* cited by examiner

WAFER ETCHING TECHNIQUES

BACKGROUND OF THE INVENTION

1. Field of the Invention

The present invention relates generally to semiconductor wafers, and more particularly to methods for the gas plasma etching of backside through vias on semiconductor wafers, especially thinned semiconductor wafers.

2. Discussion of the Related Art

Semiconductors are generally defined as materials having an electrical conductivity intermediate between metals and insulators and are used in a wide variety of modern electronic devices. The process of manufacturing semiconductors, or integrated circuits (commonly called ICs, or chips), typically consists of more than a hundred steps, during which hundreds of copies of an integrated circuit are formed on a single wafer.

Generally, the process involves the creation of eight to 20 patterned layers on and into the substrate, ultimately forming the complete integrated circuit. This layering process creates electrically active regions in and on the semiconductor wafer surface.

The first step in semiconductor manufacturing begins with production of a wafer, i.e., a thin, round slice of a semiconductor material, usually silicon. Other suitable semiconductor materials include gallium arsenide (GaAs) and indium phosphide (InP).

A silicon wafer, for example, purified polycrystalline silicon, is created from sand, is heated to a molten liquid. A small piece of solid silicon (seed) is placed on the molten liquid, and as the seed is slowly pulled from the melt the liquid cools to form a single crystal ingot. The surface tension between the seed and molten silicon causes a small amount of the liquid to rise with the seed and cool.

The crystal ingot is then ground to a uniform diameter and a diamond saw blade cuts the ingot into thin wafers. The wafer is processed through a series of machines, where it is ground smooth and chemically polished to a mirror-like luster. The wafers are then ready to be sent to the wafer fabrication area where they are used as the starting material for manufacturing integrated circuits.

The heart of semiconductor manufacturing is the wafer fabrication facility where the integrated circuit is formed in and on the wafer. The fabrication process, which takes place in a clean room, involves a series of principal steps described below. Typically, it takes from 10 to 30 days to complete the fabrication process.

Wafers are pre-cleaned using high purity, low particle chemicals (important for high-yield products). The silicon wafers are heated and exposed to ultra-pure oxygen in the diffusion furnaces under carefully controlled conditions forming a silicon dioxide film of uniform thickness on the surface of the wafer.

Masking is used to protect one area of the wafer while working on another. This process is referred to as photolithography or photo-masking. A photoresist or light-sensitive film is applied to the wafer, giving it characteristics similar to a piece of photographic paper. A photo-aligner aligns the wafer to a mask and then projects an intense light through the mask and through a series of reducing lenses, exposing the photoresist with the mask pattern. Precise alignment of the wafer to the mask prior to exposure is critical; thus, most alignment tools are fully automatic.

The wafer is then "developed" (the exposed photoresist is removed) and baked to harden the remaining photoresist pattern. It is then exposed to a chemical solution (i.e., wet etching) or a plasma gas discharge (i.e., dry etching) so that areas not covered by the hardened photoresist are etched away. Wet etching is the process of removing exposed silicon dioxide in the pattern created by photoresist exposure and development with a liquid, typically an organic acid. In dry etching, reactive gas plasma is used in place of a wet etching solution. Dry etching provides a higher resolution than wet etching and therefore is more likely to be used as circuit elements become smaller. Dry etching generally produces less "undercutting" of the wafer substrate under photoresist, often provides more control over etching rate, and may be necessary where the etched layer is resistant to liquid etchants. Gaseous etching is generally performed with halogenated compounds which, depending on the wafer substrate, may be bromine, chlorine, fluorine or iodine-based gases in a carrier gas. The photoresist is removed using additional chemicals or plasma and the wafer is inspected to ensure the image transfer from the mask to the top layer is correct.

Atoms with one less electron than silicon (such as boron), or one more electron than silicon (such as phosphorous), are introduced into the area exposed by the etch process to alter the electrical character of the silicon. These areas are called P-type (boron) or N-type (phosphorous) to reflect their conducting characteristics.

The thermal oxidation, masking etching and doping steps are repeated several times until the last "front end" layer is completed (i.e., all active devices have been formed).

Following completion of the "front end," the individual devices are interconnected using a series of metal depositions and patterning steps of dielectric films (insulators). Current semiconductor fabrication includes as many as three metal layers separated by dielectric layers.

Wafer thinning, more commonly known as backlapping, is generally carried out at the end of the device fabrication process in order to reduce the fabricated wafer's thermal conductivity and to speed up signal transmission across the device. Additionally, the wafer is thinned to facilitate correct operation of microwave or millimeter wave circuits, where the wafer is normally thinned from the backside surface. A uniform (i.e., isotropic) etching process is generally needed to effectively thin the wafers to the desired final thickness.

In most cases, this involves reducing the wafer thickness from an initial 400–500 μm range down to a final range typically from 250 μm or less. In fact, current manufacturers of increasingly sophisticated and miniaturized electronic devices are demanding even thinner wafers, and therefore, 125 μm or less is now a fairly common final wafer thickness requirement.

After the last metal layer is patterned, a final dielectric layer (passivation) is deposited to protect the circuit from damage and contamination. Openings (e.g., vias) are etched in this film to allow access to the top layer of metal by electrical probes and wire bonds. Additionally, it is often necessary to provide a ground plane and ground through vias on the backside surface of the semiconductor wafer. The backside ground plane and through vias are constructed to facilitate the correct operation of microwave circuits and millimeter wave circuits.

A problem arises when it is desired to create extremely small vias on the backside surfaces of these thinned semiconductor wafers in order to establish electrical connectivity between the backside surface and the front side surface of the thinned semiconductor wafer. Conventional wet chemical etchants do not provide sufficient anisotropy to etch small backside through vias to small ground pads on the front side surface of the thinned semiconductor wafer.

Therefore, there is a need to develop systems for anisotropically etching backside through vias on semiconductor wafers, especially thinned semiconductor wafers.

SUMMARY OF THE INVENTION

The present invention provides methods for the simultaneous thinning of the backside surfaces of a plurality of semiconductor wafers using a non-crystallographic and uniform etching process.

In accordance with the general teachings of the present invention, methods for etching a through via on a wafer of semiconductor material, wherein the wafer has a front side surface and a backside surface, are provided. The methods comprise applying a layer of photoresist material to the backside surface of the wafer. The layer of photoresist is then exposed to a light source though a mask having a pre-determined pattern, and is then developed, wherein the developed photoresist is removed to form at least one via in the remaining photoresist layer. The remaining photoresist layer is then baked in order to harden the remaining photoresist layer. The semiconductor material adjacent to the at least one via is then gas plasma etched to form a through via between the backside surface and the front side surface of the wafer.

Additional objects, advantages, and features of the present invention will become apparent from the following description and appended claims, taken in conjunction with the accompanying drawings.

BRIEF DESCRIPTION OF THE DRAWINGS

The same reference numerals refer to the same parts throughout the various Figures.

DETAILED DESCRIPTION OF THE PREFERRED EMBODIMENTS

The following discussion of the preferred embodiments directed to systems for etching a through via on a wafer of semiconductor material are merely exemplary in nature, and are in no way intended to limit the invention or its applications or uses. Additionally, although the present invention is particularly suitable for thinned semiconductor wafers (i.e., having a final thickness in the range of about 25 μm to about 250 μm), it is equally applicable to conventional semiconductor wafers. Furthermore, although the present invention is particularly suitable for semiconductor wafers comprised of InP materials, it is equally applicable to semiconductor wafers comprised of other semiconductor materials.

Figure 1:
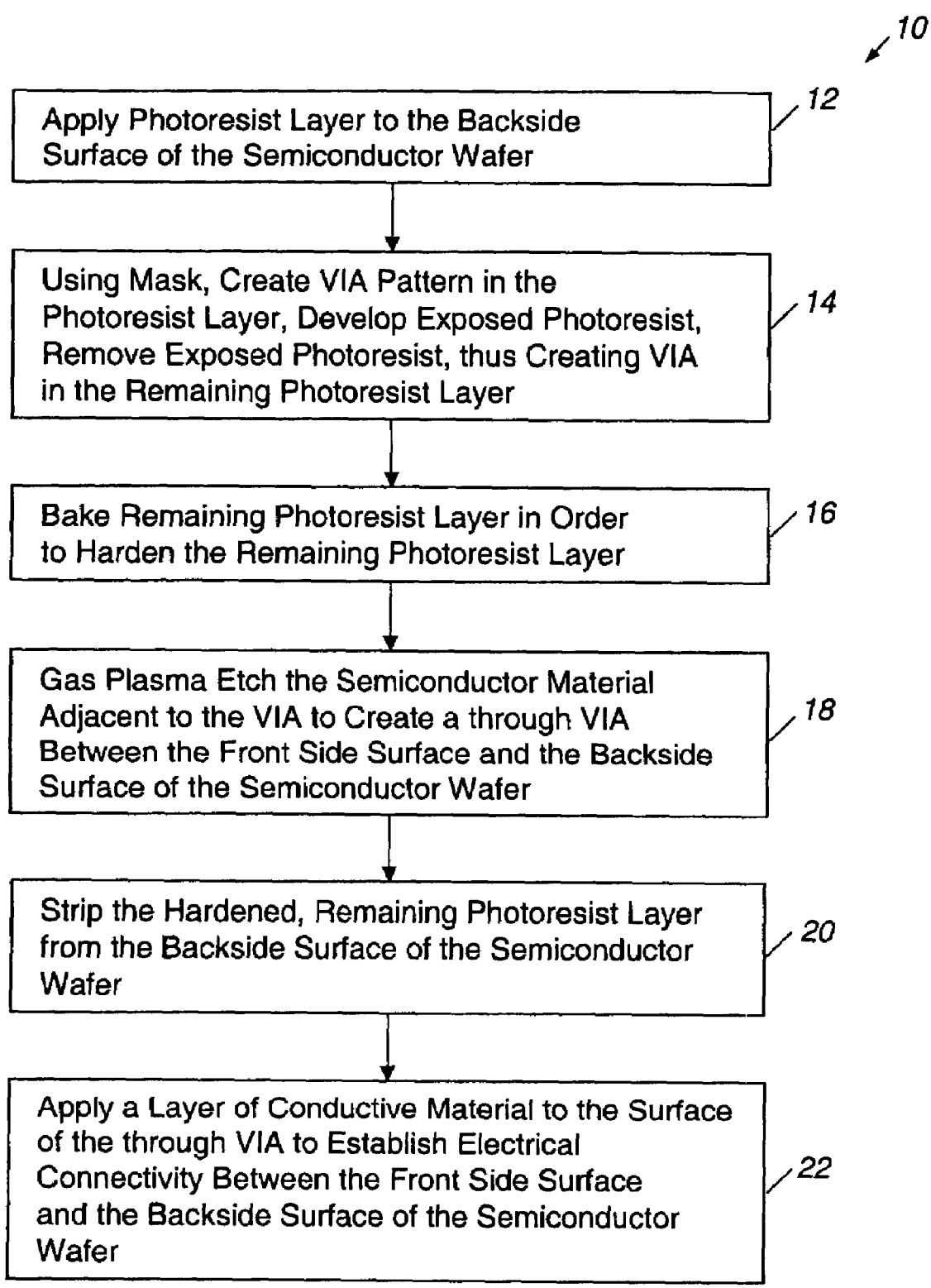
FIG. 1 is a flow diagram of the primary steps of an illustrative method for etching a through via on a wafer of semiconductor material, in accordance with one embodiment of the present invention.

With reference to FIG. 1, there is shown a flow diagram of the primary steps of an illustrative method 10 for etching a through via on a wafer of semiconductor material, in accordance with one embodiment of the present invention.

The first step 12 is to apply a layer of photoresist material to the backside surface of the semiconductor wafer. This step protects the semiconductor material from subsequent processing steps to be described below.

The second step 14 is to expose the photoresist to a light source using a mask to create a photomask, as well as the via pattern in the photoresist layer, develop the exposed photoresist, and then remove the developed photoresist. This provides a guide as to where the through vias are to be created.

The third step 16 is to bake the remaining photoresist layer in order to harden the remaining photoresist layer. This enhances the photomask:semiconductor material selectivity.

The fourth step 18 is to gas plasma etch the semiconductor material adjacent to the via in order to create a through via between the front side surface and the backside surface of the semiconductor wafer.

The fifth step 20 is to strip the hardened, remaining photoresist layer from the backside surface of the semiconductor wafer, as it has served its useful purpose and is no longer needed.

The sixth step 22 is to apply a layer of conductive material (e.g., one or more metals such as titanium, gold, etc.) to the surface of the through via (as well as the backside surface of the semiconductor wafer, if desired) to establish electrical connectivity between the front side surface and the backside surface of the semiconductor wafer.

Figure 2:
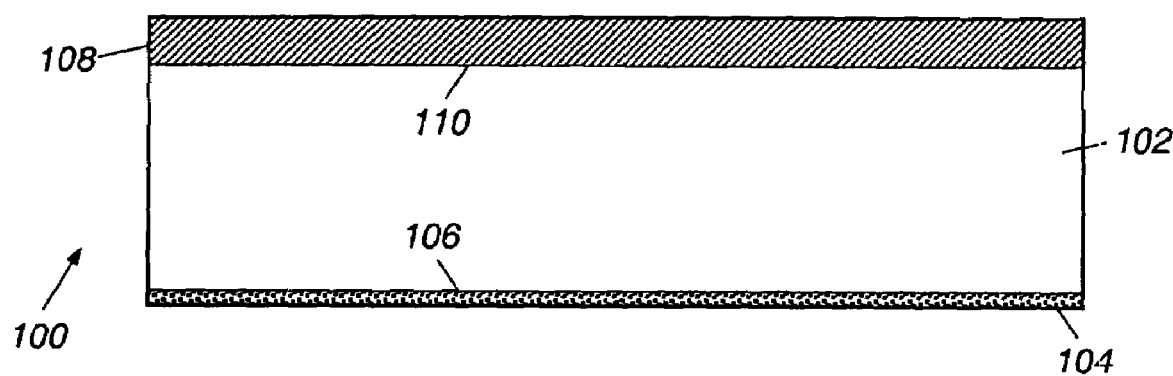
FIG. 2 is a sectional view of a wafer of semiconductor material with a layer of photoresist applied to the backside thereof, in accordance with one embodiment of the present invention.

With reference to FIG. 2, there is shown a sectional view of a wafer 100 of semiconductor material 102 with a layer of photoresist 104 applied (by any conventional method) to the backside surface 106 thereof, in accordance with one embodiment of the present invention. A metallic layer 108 is on the front side surface 110 of the wafer 100. It should be noted that the metallic layer 108 does not have to extend across the entire front side surface 110 of the wafer 100. Optional devices, such as front pads (not shown) may be mounted to the front side surface 110.

Figure 3:
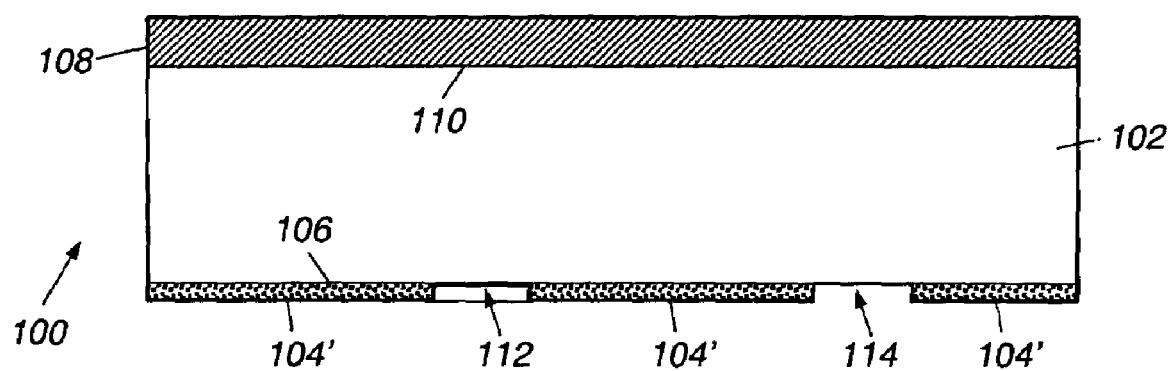
FIG. 3 is a sectional view of a wafer of semiconductor material with a patterned layer of remaining photoresist thereon and vias formed in the layer of remaining photoresist, in accordance with one embodiment of the present invention.

With reference to FIG. 3, there is shown a sectional view of a wafer 100 of semiconductor material 102 with the layer of remaining photoresist 104' thereon and at least one via formed in the layer of remaining photoresist 104', in accordance with one embodiment of the present invention. In this example, there are two vias 112 and 114 formed in the layer of remaining photoresist 104'. Additionally, the semiconductor material 102 adjacent to the vias 112, 114 is exposed (i.e., the layer of photoresist 104 has been removed as a result of the developing process).

Figure 4:
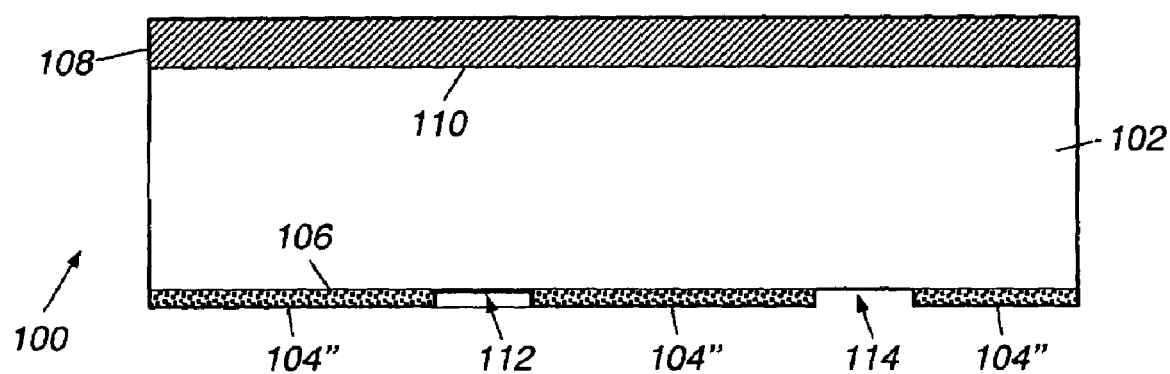
FIG. 4 is a sectional view of a wafer of semiconductor material with a layer of hardened, remaining photoresist thereon, in accordance with one embodiment of the present invention.

With reference to FIG. 4, there is shown a sectional view of a wafer 100 of semiconductor material 102 with a layer of hardened, remaining photoresist 104" thereon, in accordance with one embodiment of the present invention. The hardening of the layer of remaining photoresist 104' is done to enhance the photomask:semiconductor material (e.g., InP) selectivity before the etching process described below.

The baking of the layer of remaining photoresist 104' can be done in any number of conventional ways (e.g., oven baking, etc.). However, it has been observed that superior results are achieved with a two-step baking process in order to avoid thermal shock of the photoresist material. The first step includes heating the layer of remaining photoresist 104' at a temperature of about 130° C. to about 135° C. for about one hour. The second step includes heating the layer of remaining photoresist 104' at a temperature of about 180° C. to about 190° C. for about one hour. This process produces the layer of hardened, remaining photoresist 104" and greatly enhances the photomask:semiconductor material (e.g., InP) selectivity.

Figure 5:
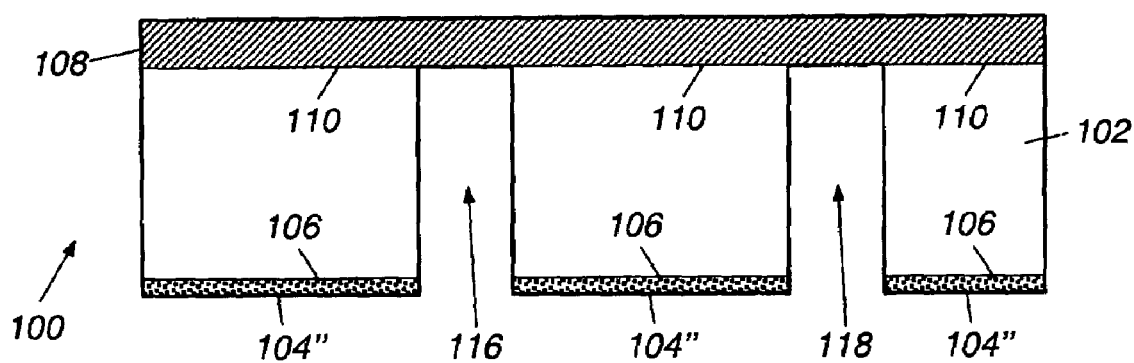
FIG. 5 is a sectional view of a wafer of semiconductor material with the semiconductor material adjacent to vias being removed by gas plasma etching so as to form through vias between the front side surface and the backside surface of the semiconductor wafer, in accordance with one embodiment of the present invention.

With reference to FIG. 5, there is shown a sectional view of a wafer 100 of semiconductor material 102 with the semiconductor material adjacent to the photoresist vias being removed by gas plasma etching so as to form at least one through via between the front side surface 110 and the backside surface 106 of the semiconductor wafer 100, in accordance with one embodiment of the present invention. In this example, two through vias 116, 118 have been formed.

The actual gas plasma etching is preferably done with a conventional electron cyclotron resonance (ECR) plasma etching machine using hydrogen gas, argon gas, boron trichloride gas, and hydrogen bromide gas. The methodology for protecting the front side surface of the semiconductor wafer, as well as mounting and fixturing are well known in the art, and will not be discussed in detail.

The etch process is comprised of many process parameters that include microwave power, radio frequency (RF) power, temperature, gas flows, and overall system pressure. Each of these parameters control the through via hole shape, the etch rate, and photomask semiconductor material etch rate selectivity. The present invention utilizes a unique parameter set for the ECR plasma etching process that provides a controllable, selective, and anisotropic etch process, especially for InP semiconductor materials.

In accordance with a preferred embodiment of the present invention, the plasma etching is conducted at a microwave power level in the range of about 700 watts to about 900 watts.

In accordance with a preferred embodiment of the present invention, the plasma etching is conducted at a radio frequency power level in the range of about 300 watts to about 500 watts.

In accordance with a preferred embodiment of the present invention, the plasma etching is conducted at a temperature in the range of about 130° C. to about 170° C.

In accordance with a preferred embodiment of the present invention, the plasma gas is a mixture of hydrogen gas, argon gas, boron trichloride gas, and hydrogen bromide gas.

In accordance with a preferred embodiment of the present invention, the hydrogen gas flows at a rate in the range of about 6 standard cubic centimeters per minute to about 10 standard cubic centimeters per minute, the argon gas flows at a rate in the range of about 15 standard cubic centimeters per minute to about 20 standard cubic centimeters per minute, the boron trichloride gas flows at a rate in the range of about 1 standard cubic centimeter per minute to about 5 standard cubic centimeters per minute, and the hydrogen bromide gas flows at a rate in the range of about 50 standard cubic centimeters per minute to about 80 standard cubic centimeters per minute.

In accordance with a preferred embodiment of the present invention, the plasma etching is conducted at a pressure in the range of about 2 mTorr to about 8 mTorr.

The etching process of the present invention can reproducibly etch through via holes as small as about 15×25 µm to about 20×30 µm.

Figure 6:
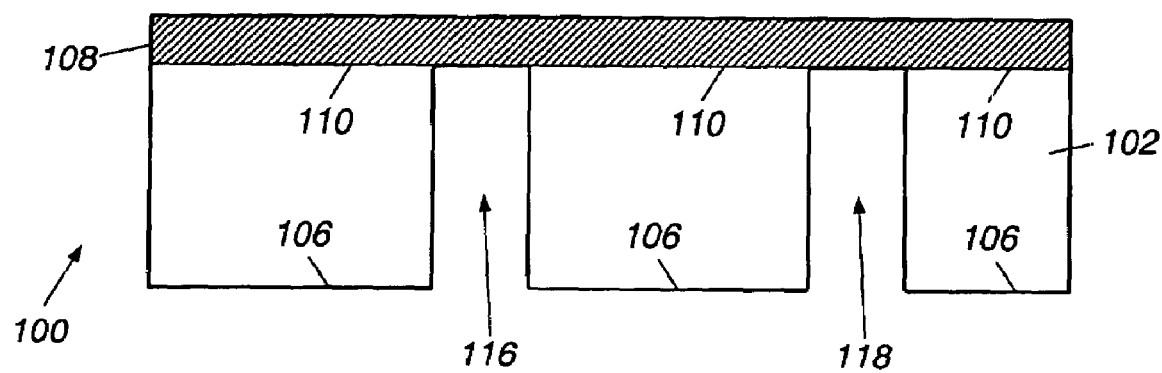
FIG. 6 is a sectional view of a wafer of semiconductor material with the hardened, remaining photoresist layer being removed to expose the backside surface of the semiconductor wafer, in accordance with one embodiment of the present invention.

With reference to FIG. 6, there is shown a sectional view of a wafer 100 of semiconductor material 102 with the layer of hardened, remaining photoresist 104" having been stripped or removed to expose the backside surface 106 of the semiconductor wafer 100, in accordance with one embodiment of the present invention. The reason the layer of hardened, remaining photoresist 104" is stripped is that it is no longer needed and must be removed in order to permit further processing steps to take place on the backside surface 106 of the semiconductor wafer 100.

Figure 7:
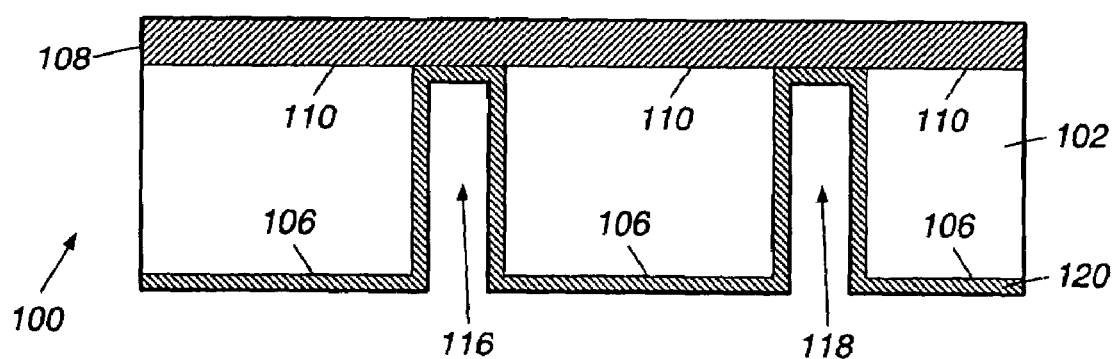
FIG. 7 is a sectional view of a wafer of semiconductor material with a layer of conductive material applied to the surface of the through vias, as well as the backside surface of the semiconductor wafer, in accordance with one embodiment of the present invention.

With reference to FIG. 7, there is shown a sectional view of a wafer 100 of semiconductor material 102 with a layer of conductive material 120 applied to the surface of the through vias 116, 118, as well as the backside surface 106 of the semiconductor wafer 100, if desired, in accordance with one embodiment of the present invention. It should be noted that the layer of conductive material 120 does not have to extend across the entire backside surface 106 of the wafer 100. By placing the layer of conductive material 120 on the surfaces of the through vias 116, 118, electrical connectivity can be established between the front side surface 110 and the backside surface 106 of the semiconductor wafer 100.

Figure 8:
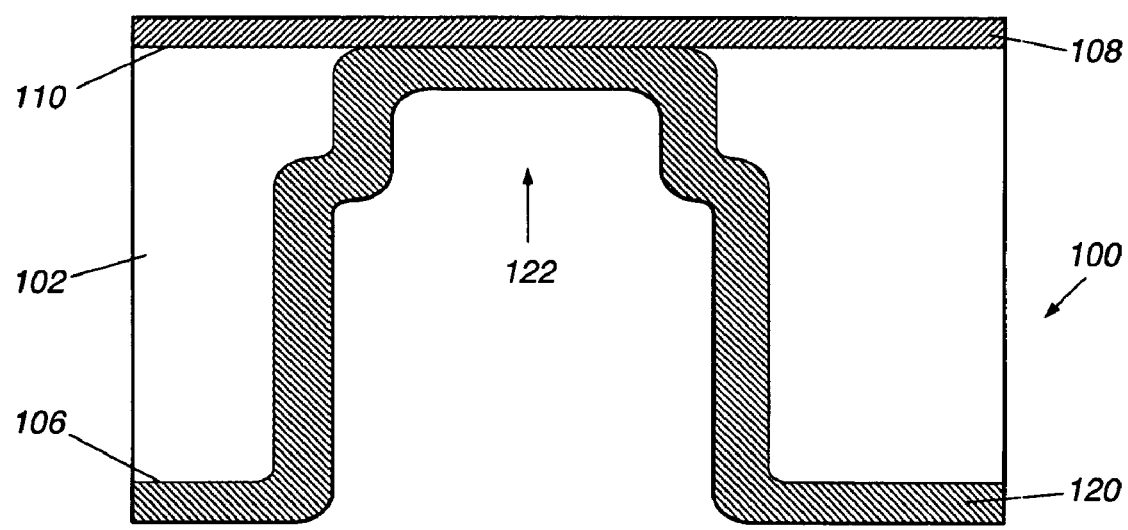
FIG. 8 is a sectional photomicrograph of a through via formed in a wafer of semiconductor material wherein the surface of the through via and the backside surface of the semiconductor wafer have had a conductive material applied thereto, in accordance with one embodiment of the present invention.

With reference to FIG. 8, there is shown a sectional photomicrograph of a through via 122 formed in a wafer 100 of semiconductor material 102 wherein the surface of the through via 122.and the backside surface 106 of the semiconductor wafer 100 have had a conductive material 120 applied thereto, in accordance with one embodiment of the present invention. Therefore, the conductive material 120 in the through via 122 is in contact, both physically and electrically, with metallic layer 108 on the front side surface 110 of the wafer 100, thus establishing electrical connectivity between the front side surface 110 and the backside surface 106 of the semiconductor wafer 100. In this manner, front side devices (e.g., small pads) can be electrically connected with backside devices (e.g., ground planes).

The foregoing discussion discloses and describes merely exemplary embodiments of the present invention. One skilled in the art will readily recognize from such discussion, and from the accompanying drawings and claims, that various changes, modifications and variations can be made therein without departing from the spirit and scope of the invention as defined in the following claims.

What is claimed is:

1. A method for etching a through via on a wafer of semiconductor material, wherein the wafer has a front side surface and a backside surface, comprising:

applying a layer of photoresist material to the backside surface of the wafer;

exposing the layer of photoresist to a light source, wherein the developed photoresist is removed to form at least one via in the remaining photoresist layer;

baking the remaining photoresist layer in order to harden the remaining photoresist layer, wherein the baking of the remaining photoresist layer comprises a first heating step wherein the remaining photoresist layer is heated at a temperature of about 130° C. to about 135° C. for about one hour, and a second heating step wherein the remaining photoresist layer is heated at a temperature of about 180° C. to about 190° C. for about one hour, and wherein the use of the first heating step and the second heating step avoids thermal shock of the photoresist layer; and gas plasma etching the semiconductor material adjacent to the at least one via to form a through via between the backside surface and the front side surface of the wafer.

2. The method according to claim 1, further comprising removing the hardened photoresist layer from the backside surface of the wafer, after the step of gas plasma etching the through via between the backside surface and the front side surface of the wafer.

3. The method according to claim 2, further comprising applying a layer of conductive material to at least a portion of a surface of the through via, after the step of removing the hardened photoresist layer from the backside surface of the wafer.

4. The method according to claim 1, wherein the plasma etching is conducted at a microwave power level in the range of about 700 watts to about 900 watts.

5. The method according to claim 1, wherein the plasma etching is conducted at a radio frequency power level in the range of about 300 watts to about 500 watts.

6. The method according to claim 1, wherein the plasma etching is conducted at a temperature in the range of about 130° C. to about 170° C.

7. The method according to claim 1, wherein the gas is a mixture of hydrogen gas, argon gas, boron trichloride gas, and hydrogen bromide gas.

8. The method according to claim 7, wherein the hydrogen gas flows at a rate in the range of about 6 standard cubic centimeter per minute to about 10 standard cubic centimeters per minute.

9. The method according to claim 7, wherein the argon gas flows at a rate in the range of about 15 standard cubic centimeter per minute to about 20 standard cubic centimeters per minute.

10. The method according to claim 7, wherein the boron trichloride gas flows at a rate in the range of about 1 standard cubic centimeter per minute to about 5 standard cubic centimeters per minute.

11. The method according to claim 7, wherein the hydrogen bromide gas flows at a rate in the range of about 50 standard cubic centimeters per minute to about 80 standard cubic centimeters per minute.

12. The method according to claim 1, wherein the plasma etching is conducted at a pressure in the range of about 2 mTorr to about 8 mTorr.

13. The method according to claim 1, wherein the semiconductor material includes indium phosphide.

14. The method according to claim 1, wherein the semiconductor wafers are incorporated into devices selected from the group consisting of microwave circuits, millimeter wave circuits, and combinations thereof.

15. The method according to claim 1, wherein the semiconductor wafers have a final thickness in the range of about 25 to about 250 µm.

* * * * *